(12) United States Patent
Hsu et al.

(10) Patent No.: US 6,569,736 B1
(45) Date of Patent: May 27, 2003

(54) METHOD FOR FABRICATING SQUARE POLYSILICON SPACERS FOR A SPLIT GATE FLASH MEMORY DEVICE BY MULTI-STEP POLYSILICON ETCH

(75) Inventors: Cheng-Yuan Hsu, Hsin-Chu (TW); Hung-Cheng Sung, Hsin-Chu (TW); Su-Chang Chen, Tao-Yuan County (TW); Han-Ping Chen, Hsin-Chu (TW); Chia-Ta Hsieh, Tainan (TW); Der-Shin Shyu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/076,668

(22) Filed: Feb. 14, 2002

(51) Int. Cl.7 .................. H01L 21/336; H01L 21/3206; H01L 21/4763
(52) U.S. Cl. ........................................ 438/267; 438/596
(58) Field of Search ................................. 438/267, 596

(56) References Cited

U.S. PATENT DOCUMENTS 6,190,961 B1 * 2/2001 Lam et al. .................. 438/253
6,358,827 B1 * 3/2002 Chen et al. ................. 438/264
6,365,455 B1 * 4/2002 Su et al. ..................... 438/257
6,372,589 B1 * 4/2002 Yu ............................. 438/197

* cited by examiner

Primary Examiner—Wael Fahmy, Jr.
Assistant Examiner—Howard Weiss
(74) Attorney, Agent, or Firm—Tung & Associates

(57) ABSTRACT

A method for forming square polysilicon spacers on a split gate flash memory device by a multi-step polysilicon etch process is described. The method can be carried out by depositing a polysilicon layer on the flash memory device structure and then depositing a sacrificial layer, such as silicon oxide, on top of the polysilicon layer. The sacrificial layer has a slower etch rate than the polysilicon layer during a main etch step. The sacrificial layer overlies the flash memory device is then removed, while the sacrificial layer on the sidewall is kept intact. The polysilicon layer that overlies the flash memory device is then etched away followed by a step of removing all residual sacrificial layers. The exposed polysilicon layer is then etched to define the square polysilicon spacers on the split gate flash memory device.

16 Claims, 3 Drawing Sheets

METHOD FOR FABRICATING SQUARE POLYSILICON SPACERS FOR A SPLIT GATE FLASH MEMORY DEVICE BY MULTI-STEP POLYSILICON ETCH

FIELD OF THE INVENTION

The present invention generally relates to a method for fabricating a split gate flash memory device and more particularly, relates to a method for fabricating square polysilicon spacers in a split gate flash memory device by a multi-step polysilicon etch process.

BACKGROUND OF THE INVENTION

In the recent trend of development in semiconductor fabrication technology, the every increasing density of devices designed on a semiconductor wafer forces the design of components of smaller dimensions. The smaller the component size, the more number of components can be accommodated on a semiconductor wafer. In the recent advancement in fabrication technology, the dimensions of the components have been reduced to sub-micron sizes or smaller. In conjunction with the miniaturization of component sizes, multiple layers of interconnects have been used in forming components of multiple layers in a stack in order to reduce the horizontal real-estate the component occupies. For instance, one of such components that has miniaturized dimensions is a non-volatile memory device which includes programmable read-only memory (PROM), erasable programmable read-only memory (EPROM) and electrically erasable programmable read-only memory (EEPROM). The trend in the development of non-volatile memory devices is toward their long term durability and high operating speed.

A flash memory device is one of the non-volatile memory devices. It may include a floating gate for storing a charge and a charge input/output control unit. Flash memory devices have been widely used in portable computers and in the telecommunication industry. For instance, a flash memory device can be used as the basic input/output system for a personal computer. High-density non-volatile memory devices are used as large capacity memory for portable terminal devices and for interface cards between a digital camera and a personal computer.

One of the key elements in low voltage read/retrieve operations is the retrieval time. In order to meet the application requirement of a portable computing system, high efficiency and fast retrieval speed are important design considerations for a non-volatile memory device. Presently, a low voltage flash memory device operates under an operating voltage between 3 and 5 volts in order to charge or discharge the floating gate. Moreover, in a read-only memory device (ROM), electrons tunnel through an energy barrier between silicon and silicon oxide to enter into an oxidized conductive region. When a voltage is applied to the gate electrode, the electrical charge tunnels through the thin silicon nitride layer.

There are numerous methods for writing and erasing into a memory device, for instance, by controlling the base material, the electrical potential between the drain region, the source region and the gate electrode such that the tunneling electron can travel from the silicon through the thin oxidation layer. Inversely, the electron is emitted outwardly during an erasing operation. In order to gain reliability and quality of the components fabricated, the tunneling oxidation layer must have superior properties. Furthermore, the information stored in a flash memory device must depend on a longtime storage of the charge in the floating gate. As a result, the dielectric layer for insulating the floating gate must have superior properties.

Flash memory devices may be formed either in a stacked structure or in a split gate structure. As the name implies, a stacked structure flash memory device has the two gate electrodes stacked in an up-and-down manner, while the gate electrodes in a split gate structure is separated from each other. FIG. 1A shows an enlarged, cross-sectional view of a conventional method for forming a split gate memory device 10. Floating gates 12 and tunneling oxide layer 14 are formed on a silicon substrate 16. Silicon oxide structure 18 and the insulating spacers 20 are used for insulation. In-between the two floating gates 12, a The polysilicon via plug 22 is provided as the common source region. The polysilicon via plug is electrically connected to the source region 24 and insulated by an insulating layer 26 on top. A polysilicon layer 28, which is used as the word line, is then deposited on top of the structure 10.

In the next step of the process for the conventional split gate flash fabrication, the polysilicon layer 28 must be etched away. However, based on the etch characteristics, the polysilicon layer 28 is etched into a curved sidewall spacer 30, as shown in FIG. 1B, which causes processing difficulties for subsequent fabrication steps. For instance, when the large curvatured sidewall spacer 30 is used as a sidewall spacer for the formation of an LDD region, difficulty arises in the fabrication process which includes the bridging of metal silicides. It is therefore desirable that the large curvatured sidewall spacers can be formed into square shouldered spacers, in other words, the vertical side of the sidewall spacers should be formed 90° with the horizontal surface.

It is therefore an object of the present invention to provide a method for forming polysilicon spacers on a split gate flash memory device that does not have the drawbacks or the shortcomings of the conventional method.

It is another object of the present invention to provide a method for forming polysilicon spacers on a split gate flash memory device that have square shoulders.

It is a further object of the present invention to provide a method for forming square polysilicon spacers on a split gate flash memory device by a multi-step polysilicon etch process.

It is another further object of the present invention to provide a method for forming square polysilicon spacers on a split gate flash memory device by depositing a sacrificial layer on top of the polysilicon sidewall spacer layer prior to the etching steps.

It is still another object of the present invention to provide a method for forming square polysilicon spacers on a split gate flash memory device by depositing a sacrificial layer on the polysilicon layer and then etching the spacers in two separate steps.

SUMMARY OF THE INVENTION

In accordance with the present invention, a method for forming square polysilicon spacers on a split gate flash memory device by multi-step polysilicon etch is provided.

In a preferred embodiment, a method for forming square polysilicon spacers on a split gate flash memory device by multi-step polysilicon etch can be carried out by the operating steps of first providing a pre-processed silicon substrate that has a split gate flash memory device formed thereon; depositing a polysilicon layer on top of the pre-processed silicon substrate; forming a sacrificial layer on top of the polysilicon layer; removing the sacrificial layer on top of the flash memory device, while leaving the sacrificial layer on the side of the flash memory device intact; etching away the polysilicon layer exposed on top of the split gate flash memory device; removing residual sacrificial layer on the side of the split gate flash memory device; and etching away the residual polysilicon layer anisotropically leaving square cornered polysilicon spacers on the split gate flash memory device.

The method for forming square polysilicon spacers on a split gate flash memory device may further include the step of forming the sacrificial layer with an insulating material, or the step of forming the sacrificial layer with silicon oxide, or the step of forming the sacrificial layer with silicon oxide by thermal oxidation. The method for forming square polysilicon spacers may further include the step of removing the sacrificial layer by a wet etch process, or the step of removing the sacrificial layer by an etchant including HF, or the step of removing the sacrificial layer by an etchant.

The present invention is further directed to a method for forming square polysilicon spacers on a split gate flash memory device by multi-step polysilicon etching including the steps of providing a semiconductor substrate; forming a tunneling oxide layer on top of the silicon substrate; depositing a polysilicon layer on top of the tunneling oxide layer; depositing a mask layer of insulating material on top of the polysilicon layer; removing the mask layer and defining the floating gate for the split gate flash memory device; forming insulating spacers on the sidewalls of the floating gate and the insulating material; forming a source region in the semiconductor substrate adjacent to the floating gate; forming a conductive via plug in-between the floating gate and the insulating material; forming an insulating layer on top of the conductive via plug; depositing a polysilicon layer on top of the conductive via plug, the floating gate and the insulating material structure; forming a sacrificial layer on top of the polysilicon layer; removing the sacrificial layer that overlies the floating gate, while maintaining the sacrificial layer on the sidewalls of the floating gate; etching away the polysilicon layer overlying the floating gate; etching away any residual sacrificial layer to expose the polysilicon layer underneath; and etching away any residual polysilicon layer to define the square-shaped polysilicon spacer on the split gate flash memory device.

The method for forming square polysilicon spacers on a split gate flash memory device by multi-step polysilicon etching may further include the step of forming the sacrificial layer with silicon oxide, or the step of forming the sacrificial layer with silicon oxide by thermal oxidation. The method may further include the step of removing the sacrificial layer with a wet etch technique, or the step of removing the sacrificial layer with an etchant including HF, or the step of removing the sacrificial layer with an etchant including BOE. The method may further include the step of forming the mask layer with $Si_3N_4$. The method may further include the step of forming the insulating structure by silicon oxide, or the step of forming the insulating structure with silicon oxide by thermal oxidation.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for forming square polysilicon spacers on a split gate flash memory device which includes the steps of first depositing a sacrificial layer on top of a polysilicon layer that is to be formed into square spacers, then by multi-step etching processes, removing the sacrificial layer that overlies the memory device such that the polysilicon layer overlies the memory device can be etched away, while the sacrificial layer on the sidewall spacer is not removed. The method then etches away the residual sacrificial layer on the sidewalls such that the polysilicon layer underneath can be etched away to define the square spacers on the memory device.

Figure 1A:
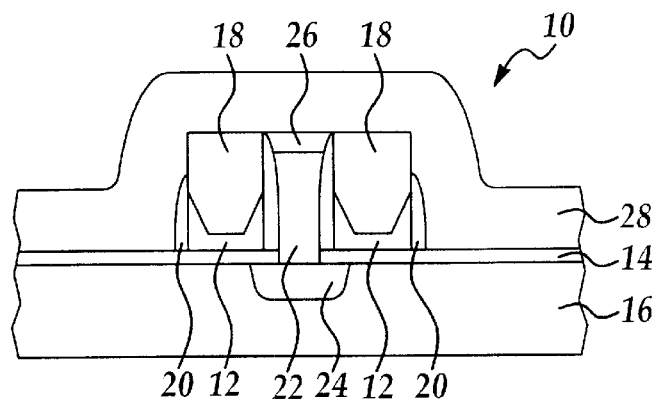
FIG. 1A is an enlarged, cross-sectional view illustrating a conventional method for forming a split gate flash memory device by first depositing a polysilicon layer on top.
Figure 1B:
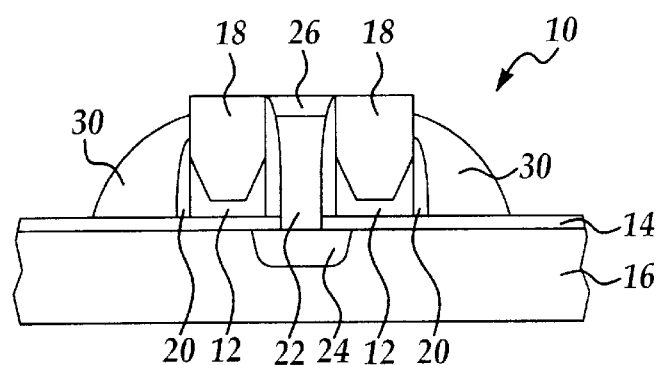
FIG. 1B is an enlarged, cross-sectional view of the conventional method for forming a split gate flash memory device of FIG. 1A with the polysilicon layer formed into sidewall spacers.
Figure 2A:
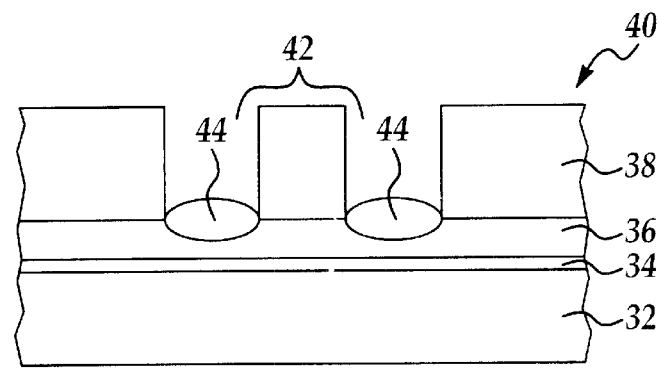
FIG. 2A is an enlarged, cross-sectional view of the present invention method for forming square spacers on a split gate flash memory device by first forming the floating gates.

The present invention novel method for forming square polysilicon spacers on a split gate flash memory device can be carried out by the operating steps shown in FIGS. 2A~2H. Referring to FIG. 2A, wherein a present invention device 40 is shown which is built on a silicon substrate 32. The silicon substrate 32 is a single crystal silicon having a crystallographic orientation of (100) or (111). While silicon substrate is illustrated here, other semiconductor materials may also be used for the substrate material. On top of the silicon substrate 32, a multiplicity of active areas may be formed by insulating from each other with field oxide or trench oxide.

On top of the silicon substrate 32 is then formed a tunneling oxide layer 34 with silicon oxide. The tunneling oxide layer 34 can be formed by thermal oxidation in an oxygen environment at a temperature between about 700° C. and about 1100° C. Other methods such as chemical vapor deposition may also be used to deposit the tunneling oxide layer 34. In the preferred embodiment of the present invention, the tunneling oxide layer 34 is formed to a thickness between about 15 Å and about 250 Å.

As shown in FIG. 2A, a polysilicon layer 36 is then deposited on top of the tunneling oxide layer 34 and then doped with a dopant. A suitable dopant for doping with phosphor ions is $PH_3$. The doping process can be carried out in-situ with the polysilicon deposition process. A mask layer 38 is then formed on top of the doped polysilicon layer 36 and then patterned for the floating gate region 42. In order to improve the efficiency of the floating gate, it is desirable that the floating gate should be formed with sharp corners, such as those shown in FIG. 2F. Several different methods may be used to form floating gates with sharp corners. In the present invention, a partial silicon oxide formation is used to illustrate the method, however, the present invention method is not limited to such partial silicon oxide formation method. For instance, the field oxide region 44 may be formed by a wet oxidation technique, followed by the removal of the field oxide region 44 to form the floating gates 50 that are equipped with sharp corners. This is shown in FIG. 2F.

The mask layer 38 may be formed by any suitable material including a photoresist material. In the preferred embodiment, a layer of silicon oxide is used as the mask layer 38. The silicon oxide mask layer 38 may be formed by a precursor gas containing $SiH_4$, $NH_3$, $N_2$ and $N_2O$ at a reaction temperature between about 300° C. and about 800° C. The masking silicon nitride layer 38 may be formed by any suitable techniques, such as low pressure chemical vapor deposition (LPCVD), plasma enhanced chemical vapor deposition (PECVD) or high-density plasma chemical vapor deposition (HDPCVD).

Figure 2B:
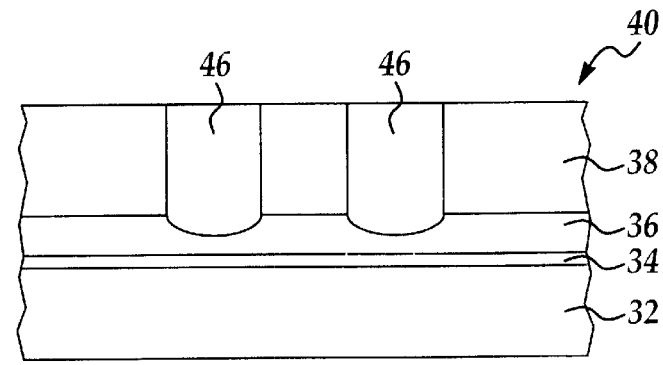
FIG. 2B is an enlarged, cross-sectional view of the present invention square spacers for a split gate flash memory device of FIG. 2A with insulating material deposited on the floating gates.
Figure 2C:
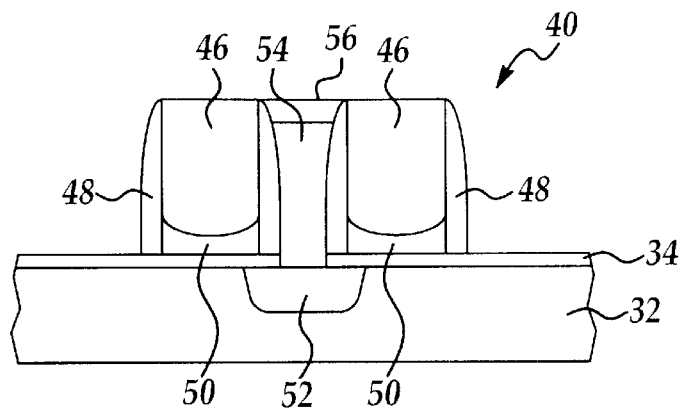
FIG. 2C is an enlarged, cross-sectional view of the present invention square spacers for a split gate flash memory device of FIG. 2B with a polysilicon via plug formed and insulated.

As shown in FIG. 2B, an insulating material layer 46, such as silicon oxide or equivalent, is then deposited on top of the silicon nitride layer 38 to fill the openings for the field oxide regions 44. The silicon oxide layer 46 can be deposited by a chemical vapor deposition technique on top of the mask layer 38 and the field oxide regions 44. The silicon oxide layer 46 may be deposited by the plasma enhanced CVD technique, the sub-atmospheric pressure CVD technique or the TEOS-ozone technique. The TEOS-ozone technique can be conducted at a reaction temperature between about 400° C. and about 480° C. Following the deposition process of the silicon oxide layer 46, a chemical mechanical polishing method is utilized to remove the excess silicon oxide layer on top of the mask layer 38. The mask layer 38 is then removed to define the floating gates 50, as shown in FIG. 2C.

In the next step of the present invention method, insulating spacers 48 are then formed on the floating gates 50 and the insulating material 46. The spacers 48 are formed by an anisotropic etching technique to etch away an insulating material layer or a dielectric material layer blanket deposited on top of the structure. For simplicity reasons, the insulating or dielectric material layer is not shown in FIG. 2C. A photoresist layer is then used as a mask to carry out an ion implantation process to form the source region 52 in the silicon substrate 32. The photoresist layer is then removed. A polysilicon via plug 54 is then formed in-between the floating gates 50 and the insulating material 46 for providing electrical communication with the source region 52. An insulating material or an insulating structure 56 is then formed of a material such as silicon oxide on top of the polysilicon via plug 54.

Figure 2D:
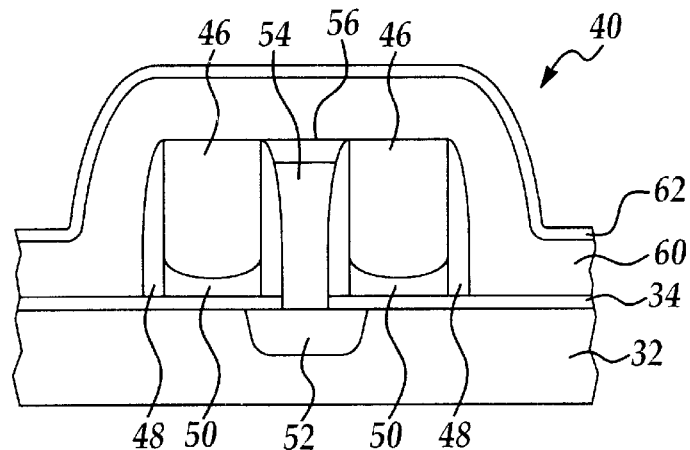
FIG. 2D is an enlarged, cross-sectional view of the present invention split gate flash memory device of FIG. 2C with a polysilicon layer and a sacrificial layer deposited on top.

In the next step of the process, as shown in FIG. 2D, a doped polysilicon layer 60 is first deposited on top of the polysilicon via plug 54, the floating gates 50 and the insulating material layer 46. The doped polysilicon layer 60 can be deposited by using $PH_3$ as the source for the dopant ions and in-situ deposited into polysilicon during deposition or implanted after the deposition process. A sacrificial layer 62 having a uniform thickness is then deposited on top of the doped polysilicon layer 60. The material for the sacrificial layer 62 is selected such that it has a slower etch rate when compared to the polysilicon layer 60. In the present invention preferred embodiment, the sacrificial layer 62 of silicon oxide may be formed by thermal oxidation, or by a deposition technique.

Figure 2E:
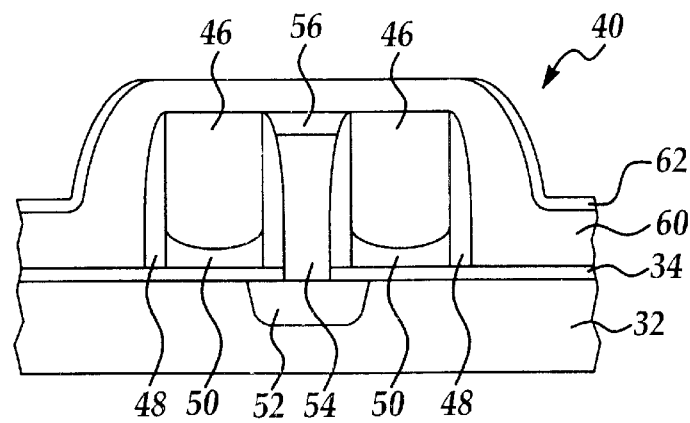
FIG. 2E is an enlarged, cross-sectional view of the present invention split gate flash memory device of FIG. 2D with the sacrificial layer overlying the memory device removed.
Figure 2F:
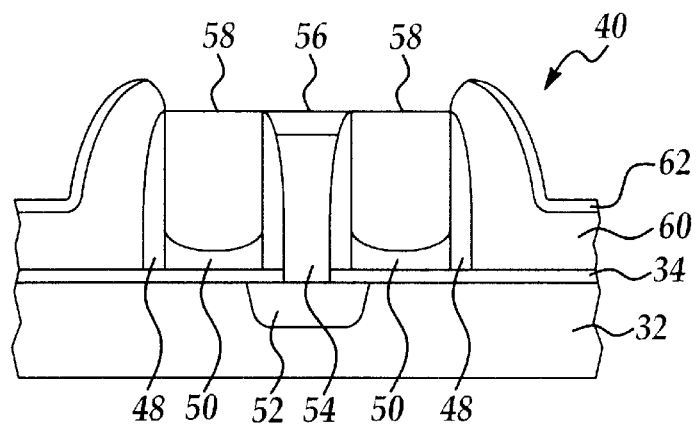
FIG. 2F is an enlarged, cross-sectional view of the present invention split gate flash memory device of FIG. 2E with the polysilicon layer overlying the memory device etched away.
Figure 2G:
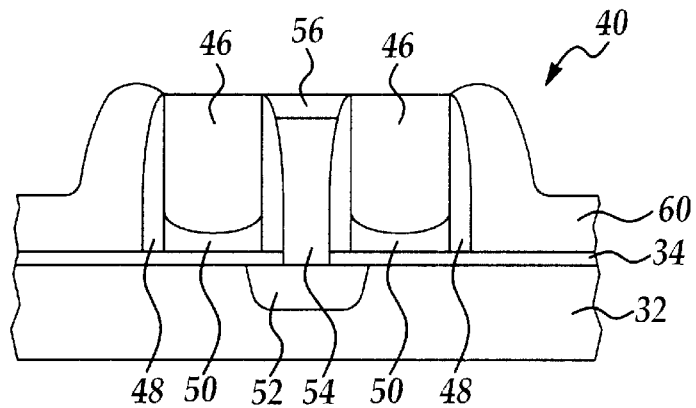
FIG. 2G is an enlarged, cross-sectional view of the present invention split gate flash memory device of FIG. 2F with the residual sacrificial layer removed.
Figure 2H:
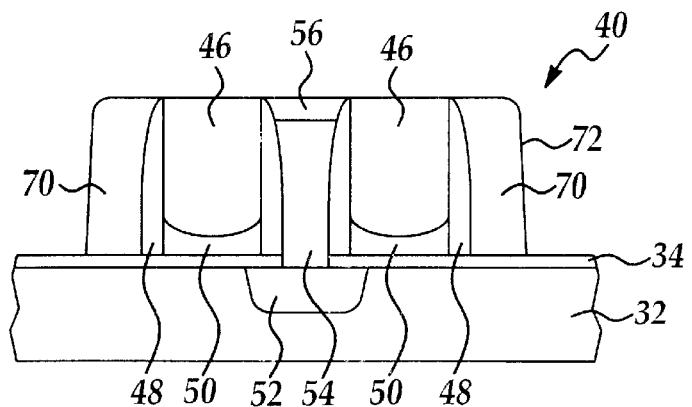
FIG. 2H is an enlarged, cross-sectional view of the present invention split gate flash memory device of FIG. 2G with the square spacers formed on the memory device.

As shown in FIGS. 2E, 2F and 2G, a multi-step etching method is used to form square spacers 70 on the present invention split gate flash memory device 40. Anisotropic etching method is first used to remove the horizontal surface of the sacrificial layer 62, as shown in FIG. 2E, while the sacrificial layer 62 on the sidewall of the present invention memory device 40 is kept intact. The etching of the sacrificial layer 62, i.e. the silicon oxide layer, can be carried out by using an etchant such as a HF solution or a BOE solution.

A main etching step is then carried out, as shown in FIG. 2F, to remove the polysilicon layer 60 that is on the horizontal surface, i.e. that overlies the flash memory device 40, exposing the top surface 58. The sacrificial layer 62, which has a much lower etch rate, protects the polysilicon layer 60 that is covered by the sacrificial layer 62. This is shown in FIG. 2F.

The residual sacrificial layer 62 is then etched away, as shown in FIG. 2G, to expose the polysilicon layer 60 that is covered by the residual sacrificial layer 62. This is shown in FIG. 2G. A main etch process is then carried out to define the pattern of the spacers 70 to achieve a vertical sidewall 72 on the spacers 70. The polysilicon spacers 70, that have the vertical sidewalls 72, can then be used as the control gate, while the insulating spacer 48 is used for insulating the floating gate 50 and the control gate 70. The present invention split gate flash memory device 40 is thus fabricated.

The present invention method for forming square polysilicon spacers on a split gate flash memory device by a multi-step polysilicon etch method have therefore been amply described in the above description and in the appended drawings of FIGS. 2A~2H.

While the present invention has been described in an illustrative manner, it should be understood that the terminology used is intended to be in a nature of words of description rather than of limitation.

Furthermore, while the present invention has been described in terms of a preferred, it is to be appreciated that those skilled in the art will readily apply these teachings to other possible variations of the inventions.

The embodiment of the invention in which an exclusive property or privilege is claimed are defined as follows:

What is claimed is:

1. A method for forming square polysilicon spacers on a split gate flash memory device by multi-step polysilicon etch comprising the steps of:

providing a pre-processed silicon substrate that has a split gate flash memory device formed thereon;

depositing a polysilicon layer on top of said pre-processed silicon substrate;

forming a sacrificial layer on top of the polysilicon layer;

removing said sacrificial layer on top of the flash memory device, while leaving the sacrificial layer on the side of the flash memory device intact;

etching away the polysilicon layer exposed on top of the split gate flash memory device;

removing residual sacrificial layer on the side of the split gate flash memory device; and etching away the residual polysilicon layer anisotropically leaving square cornered polysilicon spacers on said split gate flash memory device.

2. A method for forming square polysilicon spacers on a split gate flash memory device by multi-step polysilicon etch according to claim 1 further comprising the step of forming the sacrificial layer with an insulating material.

3. A method for forming square polysilicon spacers on a split gate flash memory device by multi-step polysilicon etch according to claim 1 further comprising the step of forming the sacrificial layer with silicon oxide.

4. A method for forming square polysilicon spacers on a split gate flash memory device by multi-step polysilicon etch according to claim 1 further comprising the step of forming the sacrificial layer with silicon oxide by thermal oxidation.

5. A method for forming square polysilicon spacers on a split gate flash memory device by multi-step polysilicon etch according to claim 1 further comprising the step of removing the sacrificial layer by a wet etch process.

6. A method for forming square polysilicon spacers on a split gate flash memory device by multi-step polysilicon etch according to claim 1 further comprising the step of removing the sacrificial layer by an etchant comprising HF.

7. A method for forming square polysilicon spacers on a split gate flash memory device by multi-step polysilicon etch according to claim 1 further comprising the step of removing the sacrificial layer by an etchant.

8. A method for forming square polysilicon spacers on a split gate flash memory device by multi-step polysilicon etching comprising the steps of:

providing a semiconductor substrate;

forming a tunneling oxide layer on top of the silicon substrate;

depositing a polysilicon layer on top of the tunneling oxide layer;

depositing a mask layer of insulating material on top of the polysilicon layer;

removing the mask layer and defining the floating gate for the split gate flash memory device;

forming insulating spacers on the sidewalls of the floating gate and the insulating material;

forming a source region in the semiconductor substrate adjacent to the floating gate;

forming a conductive via plug in-between the floating gate and the insulating material;

forming an insulating layer on top of the conductive via plug;

depositing a polysilicon layer on top of the conductive via plug, the floating gate and the insulating material structure;

forming a sacrificial layer on top of the polysilicon layer;

removing the sacrificial layer that overlies the floating gate, while maintaining the sacrificial layer on the sidewalls of the floating gate;

etching away the polysilicon layer overlying the floating gate;

etching away any residual sacrificial layer to expose the polysilicon layer underneath; and etching away any residual polysilicon layer to define the square-shaped polysilicon spacer on the split gate flash memory device.

9. A method for forming square polysilicon spacers on a split gate flash memory device by multi-step polysilicon etching according to claim 8 further comprising the step of forming the sacrificial layer with silicon oxide.

10. A method for forming square polysilicon spacers on a split gate flash memory device by multi-step polysilicon etching according to claim 8 further comprising the step of forming the sacrificial layer with silicon oxide by thermal oxidation.

11. A method for forming square polysilicon spacers on a split gate flash memory device by multi-step polysilicon etching according to claim 8 further comprising the step of removing the sacrificial layer with a wet etch technique.

12. A method for forming square polysilicon spacers on a split gate flash memory device by multi-step polysilicon etching according to claim 8 further comprising the step of removing the sacrificial layer with an etchant comprising HF.

13. A method for forming square polysilicon spacers on a split gate flash memory device by multi-step polysilicon etching according to claim 8 further comprising the step of removing the sacrificial layer with an etchant comprising BOE.

14. A method for forming square polysilicon spacers on a split gate flash memory device by multi-step polysilicon etching according to claim 8 further comprising the step of forming the mask layer with $Si_3N_4$.

15. A method for forming square polysilicon spacers on a split gate flash memory device by multi-step polysilicon etching according to claim 8 further comprising the step of forming the insulating structure with silicon oxide.

16. A method for forming square polysilicon spacers on a split gate flash memory device by multi-step polysilicon etching according to claim 8 further comprising the step of forming the insulating structure with silicon oxide by thermal oxidation.

* * * * *